United States Patent
Miura et al.

(10) Patent No.: US 12,308,254 B2
(45) Date of Patent: May 20, 2025

(54) LOAD LOCK DEVICE

(71) Applicant: Canon Anelva Corporation, Kawasaki (JP)

(72) Inventors: Jun Miura, Hachioji (JP); Naoya Fukuda, Chofu (JP); Shuji Kumagai, Tama (JP); Shinji Takagi, Tama (JP); Tetsuro Toda, Machida (JP); Hidetoshi Shimokawa, Fuchu (JP); Satoshi Negishi, Hachioji (JP); Satoshi Nomura, Tama (JP); Junya Soeda, Yokohama (JP)

(73) Assignee: Canon Anelva Corporation, Kawasaki (JP)

( * ) Notice: Subject to any disclaimer, the term of this patent is extended or adjusted under 35 U.S.C. 154(b) by 661 days.

(21) Appl. No.: 17/576,111

(22) Filed: Jan. 14, 2022

(65) Prior Publication Data

US 2022/0139729 A1 May 5, 2022

Related U.S. Application Data

(63) Continuation of application No. PCT/JP2020/033160, filed on Sep. 2, 2020.

(51) Int. Cl.
*H01L 21/67* (2006.01)
*H01L 21/677* (2006.01)
*H01L 21/687* (2006.01)

(52) U.S. Cl.
CPC ...... *H01L 21/67017* (2013.01); *H01L 21/677* (2013.01); *H01L 21/68764* (2013.01); *H01L 21/68785* (2013.01)

(58) Field of Classification Search
CPC ............. H01L 21/67017; H01L 21/677; H01L 21/68764; H01L 21/68785; H01L 21/67739; H01L 21/67201
See application file for complete search history.

(56) References Cited

U.S. PATENT DOCUMENTS 5,580,420 A 12/1996 Watanabe et al.
7,076,920 B2 * 7/2006 Holcomb .......... H01L 21/67253
414/217

(Continued)

FOREIGN PATENT DOCUMENTS

CN 1854839 A 11/2006
CN 102157420 A 8/2011
(Continued)

OTHER PUBLICATIONS

Notification of the First Office Action issued on Jul. 20, 2023, by the Chinese Patent Office in corresponding Chinese Patent Application No. 202080051147.7, and an English Translation of the Office Action. (18 pages).

(Continued)

*Primary Examiner* — Kaitlin S Joerger
(74) *Attorney, Agent, or Firm* — Buchanan Ingersoll & Rooney PC

(57) ABSTRACT

A load lock device includes a load lock chamber including a first conveyance port connected to a transfer chamber connected to a reduced-pressure processing device, and a second conveyance port connected to a loader chamber; a substrate holder configured to hold a substrate in the load lock chamber; a driving mechanism arranged below the load lock chamber to move the substrate holder up and down and connected to the substrate holder via a connecting member; an extension chamber extended from a lower portion of the load lock chamber to a side; and a pump arranged below the extension chamber and configured to discharge a gas in the load lock chamber via the extension chamber. The extension chamber includes a bottom surface with an opening at a position deviated from a vertically lower position of the substrate holder, and the pump is connected to the opening.

29 Claims, 6 Drawing Sheets

(56) References Cited

U.S. PATENT DOCUMENTS

| | | | |
|---|---|---|---|
| 2002/0159864 A1* | 10/2002 | Lowrance | H01L 21/67126 |
| | | | 414/217 |
| 2003/0103836 A1* | 6/2003 | Beaulieu | H01L 21/67201 |
| | | | 414/217 |
| 2006/0231027 A1 | 10/2006 | Iwabuchi | |
| 2007/0107598 A1 | 5/2007 | Lee | |
| 2007/0175395 A1 | 8/2007 | Oh | |
| 2009/0016855 A1 | 1/2009 | Hofmeister et al. | |
| 2010/0022093 A1 | 1/2010 | Yamaguchi | |
| 2010/0054905 A1 | 3/2010 | Behdjat et al. | |
| 2011/0168330 A1 | 7/2011 | Sakaue et al. | |
| 2012/0170999 A1 | 7/2012 | Sakaue | |
| 2013/0248014 A1 | 9/2013 | Kobayashi et al. | |
| 2014/0003891 A1* | 1/2014 | Kobayashi | H01L 21/67201 |
| | | | 414/217 |
| 2014/0209024 A1 | 7/2014 | Kim et al. | |
| 2016/0240406 A1 | 8/2016 | Kajihara | |
| 2021/0202282 A1* | 7/2021 | Weichart | H01L 21/67201 |
| 2021/0343559 A1* | 11/2021 | Amikura | H01L 21/67184 |
| 2022/0139761 A1* | 5/2022 | Miura | H01L 21/677 |
| | | | 414/217 |

FOREIGN PATENT DOCUMENTS

| | | | |
|---|---|---|---|
| CN | 102414809 A | 4/2012 | |
| CN | 103733309 A | 4/2014 | |
| CN | 105723496 A | 6/2016 | |
| JP | H06158284 A | 6/1994 | |
| JP | H07235394 A | 9/1995 | |
| JP | H1050802 A | 2/1998 | |
| JP | H11186355 A | 7/1999 | |
| JP | H11217670 A | 8/1999 | |
| JP | 2001291758 A | 10/2001 | |
| JP | 2002075882 A | 3/2002 | |
| JP | 2004503099 A | 1/2004 | |
| JP | 2004087781 A | 3/2004 | |
| JP | 2004 349332 A | 12/2004 | |
| JP | 2010199461 A | 9/2010 | |
| JP | 2011127136 A | 6/2011 | |
| KR | 10-2011-0059728 A | 6/2011 | |
| KR | 101522324 B1 | 5/2015 | |
| WO | 2012077547 A1 | 6/2012 | |
| WO | 2018226503 A1 | 12/2018 | |

OTHER PUBLICATIONS

Office Action (Notice of Preliminary Rejection) issued on Oct. 26, 2023, by the Korean Patent Office in corresponding Korean Patent Application No. 10-2022-7003150, and an English Translation of the Office Action. (9 pages).

Extended European Search Report dated Sep. 6, 2023, issued by the European Patent Office in corresponding European Application No. 20861735.7-1211, (8 pages).

International Search Report (PCT/ISA/210) with translation and Written Opinion (PCT/ISA/237) mailed on Nov. 2, 2020, by the Japan Patent Office as the International Searching Authority for International Application No. PCT/JP2020/033160.

Taiwan Search Report for Taiwan Application No. 109130336 dated May 9, 2021 (13 pages).

Office Action issued on Jul. 9, 2024, by the Singaporean Patent Office in corresponding Singaporean Patent Application No. 11202200803R. (11 pages).

Office Action issued on Jun. 14, 2024, by the Korean Patent Office in corresponding Korean Patent Application No. 10-2022-7003150, and an English Translation of the Office Action. (8 pages).

* cited by examiner

LOAD LOCK DEVICE

CROSS-REFERENCE TO RELATED APPLICATIONS

This application is a Continuation of International Patent Application No. PCT/JP2020/033160, filed Sep. 2, 2020, which claims the benefit of International Patent Application No. PCT/JP2019/035247, filed Sep. 6, 2019, both of which are hereby incorporated by reference herein in their entirety.

BACKGROUND OF THE INVENTION

Field of the Invention

The present invention relates to a load lock device.

Background Art

Japanese Patent Laid-Open No. 11-217670 discloses a load lock device including a vacuum container, a substrate table that moves up and down in the vacuum container, and a high vacuum pump connected to the vacuum container via an opening arranged, on the lower side of the substrate table, in the bottom surface of the vacuum container.

In the configuration in which the pump connected to the vacuum container via the opening arranged, on the lower side of the substrate table, in the bottom surface of the vacuum container, is arranged, particles generated by the pump or particles sucked by the pump and bounced by the pump may blow up, reach the space above a substrate, and adhere to the substrate. Such particles may cause a manufacturing failure of an article manufactured using the substrate. If the gap between the side surface of the substrate table and the inner surface of the vacuum container is made small to suppress the blow-up of the particles to the space above the substrate, the exhaust efficiency of the pump may become lower.

SUMMARY OF INVENTION

The present invention provides a technique advantageous in reducing blow-up of particles from a pump to a space above a substrate.

One aspect of the present invention is related to a load lock device, and the load lock device comprises a load lock chamber including a first conveyance port connected to a transfer chamber connected to a reduced-pressure processing device, and a second conveyance port connected to a loader chamber, a substrate holder configured to hold a substrate in the load lock chamber, a driving mechanism arranged below the load lock chamber to move the substrate holder up and down and connected to the substrate holder via a connecting member, an extension chamber extended from a lower portion of the load lock chamber to a side, and a pump arranged below the extension chamber and configured to discharge a gas in the load lock chamber via the extension chamber, wherein the extension chamber includes a bottom surface with an opening at a position deviated from a vertically lower position of the substrate holder, and the pump is connected to the opening.

Further features of the present invention will become apparent from the following description of exemplary embodiments with reference to the attached drawings.

DESCRIPTION OF THE EMBODIMENTS

Figure 1:
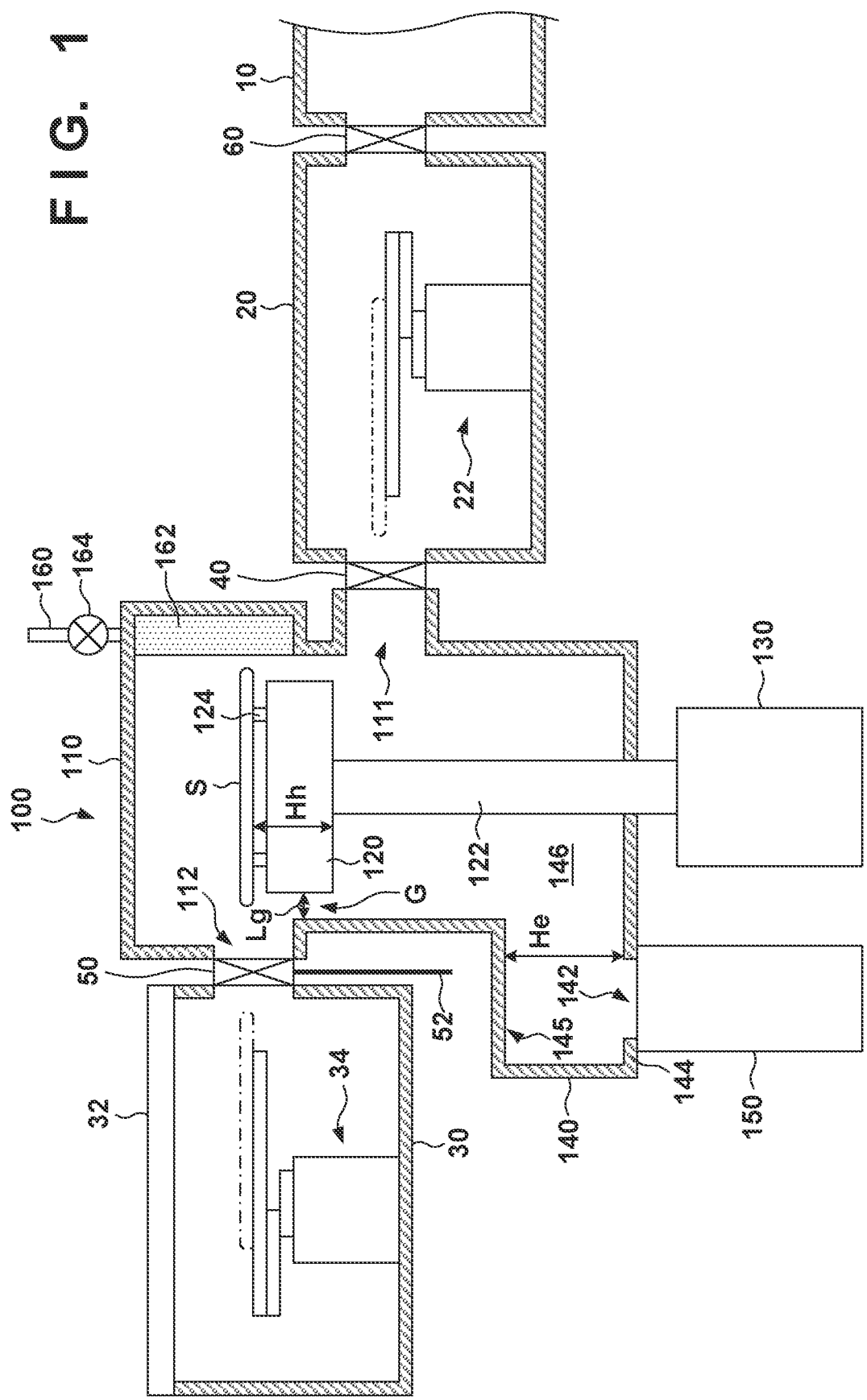
FIG. 1 is a view schematically showing the configuration of a processing device including a load lock device according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 schematically shows the configuration of a processing device including a load lock device 100 according to an embodiment of the present invention. The load lock device 100 can include a load lock chamber 110 arranged between a loader chamber 30 and a transfer chamber 20. The loader chamber 30 can be maintained in an atmospheric environment. In the loader chamber 30, for example, a substrate S can be provided from a carrier. Alternatively, the substrate S can be provided from a pre-processing device to the loader chamber 30. The loader chamber 30 can include a filter 32 on the ceiling, and a downflow can be supplied to the internal space of the loader chamber 30 via the filter 32. A conveyance robot 34 is arranged in the loader chamber 30, and the substrate S can be conveyed by the conveyance robot 34. The conveyance robot 34 can convey the substrate S from the loader chamber 30 to the load lock chamber 110 via a valve 50. The pressure in the load lock chamber 110 to which the substrate S is conveyed is sufficiently reduced. After that, a conveyance robot 22 arranged in the transfer chamber 20 can convey the substrate S from the load lock chamber 110 to the transfer chamber 20 via a valve 40. After that, the conveyance robot 22 can convey the substrate S from the transfer chamber 20 to a reduced-pressure processing device 10 via a valve 60. The reduced-pressure processing device 10 can be one of, for example, a CVD device, a PVD device, an etching device, a plasma processing device, and an electron-beam exposure device.

The load lock chamber 110 can include a first conveyance port 111 connected to the transfer chamber 20 connected to the reduced-pressure processing device 10, and a second conveyance port 112 connected to the loader chamber 30. In an example, the height of the first conveyance port 111 (for example, the height of the lower end of the first conveyance port 111) is lower than the height of the second conveyance port 112 (for example, the height of the lower end of the second conveyance port 112). The first conveyance port 111 can be arranged to communicate with the internal space of the transfer chamber 20 via the valve 40. The second conveyance port 112 can be arranged to communicate with the internal space of the loader chamber 30 via the valve 50.

The load lock device 100 can include a substrate holder 120 that holds the substrate S in the load lock chamber 110. The substrate holder 120 can include, for example, a plurality of contact portions 124 that contact the substrate S to hold the substrate S. The load lock device 100 can include a driving mechanism 130. The driving mechanism 130 can be arranged on the lower side of the load lock chamber 110 to move the substrate holder 120 up and down. The driving mechanism 130 can be connected to the substrate holder 120 via a connecting member 122.

The load lock chamber 110 can include an extension chamber 140 extended from the lower portion of the load lock chamber 110 to a side, and a pump 150 arranged on the lower side of the extension chamber 140 and discharge a gas in the load lock chamber 110 via the extension chamber 140. The extension chamber 140 can include a bottom surface 144 with an opening 142 at a position deviated from the vertically lower position of the substrate holder 120. The pump 150 can be connected to the opening 142. Although not illustrated, a valve can be arranged between the pump 150 and the opening 142.

The pump 150 can include, for example, a rotary pump, and a turbomolecular pump arranged between the rotary pump and the opening 142. The turbine of the turbomolecular pump rotates at a high speed during the operation. If particles sucked by the turbomolecular pump collide against the turbine, these may be bounced by the turbine. In addition, the pump 150 itself may generate particles independently of whether the pump 150 is a turbomolecular pump or not. Hence, it is preferable that the pump 150 is connected to the opening 142 provided in the bottom surface 144 of the extension chamber 140 extended from the lower portion of the load lock chamber 110 to the side. This can reduce the particles from the pump 150 reaching the space above the substrate S via a gap G between the side surface of the substrate holder 120 and the inner side surface of the load lock chamber and adhering to the substrate S.

The load lock device 100 can include a gas introducing portion 160 that introduces a gas (for example, clean dry air or nitrogen gas) into the load lock chamber 110. The gas introducing portion 160 can be arranged above a path between the substrate holder 120 and the transfer chamber 20 in a state in which, for example, the substrate S is conveyed to the transfer chamber 20 via the first conveyance port 111. In an example, the gas introducing portion 160 can be arranged above the first conveyance port 111. The gas introducing portion 160 can include a gas dispersing portion 162 that disperses the gas to the internal space of the load lock chamber 110. At least a part of the gas dispersing portion 162 can be arranged in the load lock chamber 110. The gas dispersing portion 162 can be arranged at a position facing the second conveyance port 112. The gas introducing portion 160 can include a flow adjusting valve 164 that adjusts the gas introduction.

A gas discharge line 52 can be connected to the valve 50 arranged between the loader chamber 30 and the second conveyance port 112 of the load lock chamber 110. The gas in the space near the second conveyance port 112 can be discharged to the external space of the load lock chamber 110 via the gas discharge line 52. A pump (not shown) can be connected to the gas discharge line 52.

At least a part of the second conveyance port 112 can be arranged above (vertically above) the extension chamber 140. Alternatively, at least a part of the extension chamber 140 can be arranged between the second conveyance port 112 and the pump 150. This configuration is advantageous in reducing the foot print of the load lock device 100.

At least a part of the loader chamber 30 can be arranged above (vertically above) the extension chamber 140. Alternatively, at least a part of the extension chamber 140 can be arranged between the loader chamber 30 and the pump 150. This configuration is also advantageous in reducing the foot print of the load lock device 100.

As shown in FIGS. 1 to 5, the substrate holder 120 can be arranged at a plurality of positions in the internal space of the load lock chamber 110. The plurality of positions can include a position where a part of the side surface of the substrate S held by the substrate holder 120 faces the gas dispersing portion 162, as shown in FIG. 1. Here, the part of the side surface (outer peripheral surface) of the substrate S held by the substrate holder 120 can face the gas dispersing portion 162 concerning a direction parallel to the surface of the substrate S.

Figure 6:
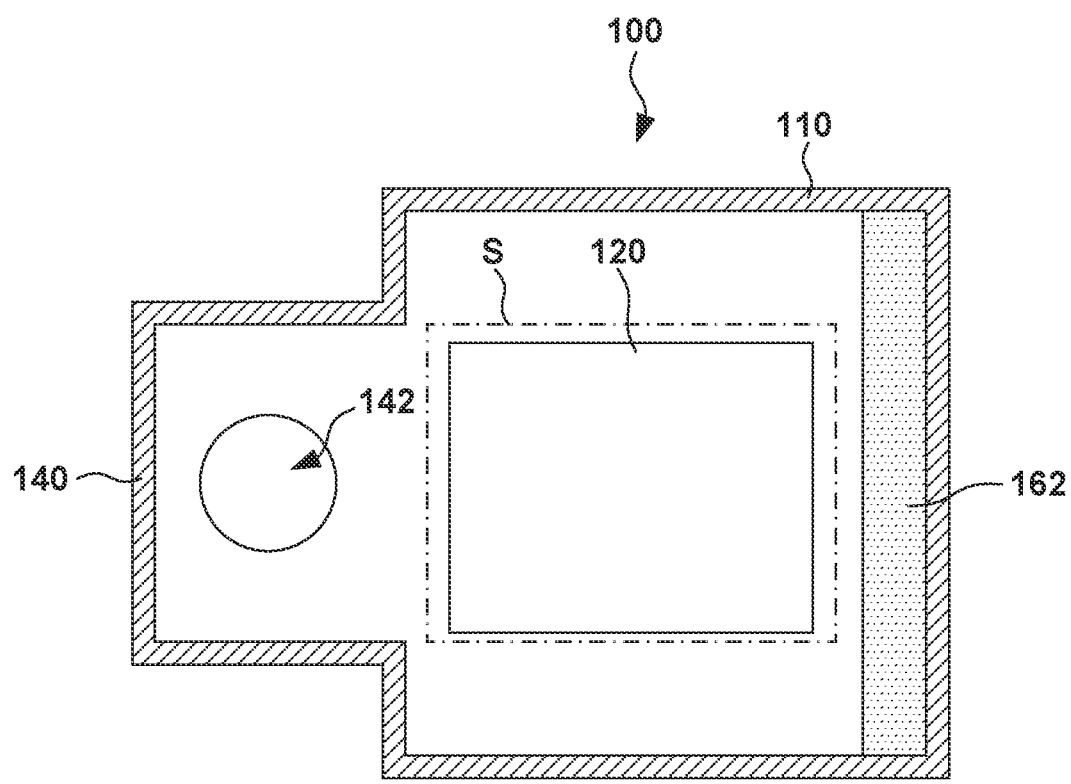
FIG. 6 is a plan view showing the arrangement of a load lock chamber, an extension chamber, and a gas dispersing portion.

FIG. 6 is a plan view showing the arrangement of the load lock chamber 110, the extension chamber 140, and the gas dispersing portion 162. This plan view can also be understood as an orthogonal projection to the floor on which the load lock device 100 is arranged. In the plan view or orthogonal projection, the substrate holder 120 can be located between the gas dispersing portion 162 and the extension chamber 140. Alternatively, in the plan view or orthogonal projection, the opening 142 can be located between the gas dispersing portion 162 and the extension chamber 140.

The substrate S held by the substrate holder 120 can have a rectangular shape. Alternatively, the substrate S held by the substrate holder 120 can have a circular shape with a notch portion indicating a reference direction. However, the substrate S held by the substrate holder 120 may have another shape.

The area of the gap G between the side surface of the substrate holder 120 and the inner side surface of the load lock chamber 110 is preferably smaller than the sectional area of the second conveyance port 112. The area of the gap G is more preferably smaller than ½, ⅓, or ¼ of the sectional area of the second conveyance port 112. When the substrate S is conveyed from the loader chamber 30 to the internal space of the load lock chamber 110 via the second conveyance port 112, this configuration is advantageous in increasing the amount of the gas introduced from the gas dispersing portion 162 to the internal space of the load lock chamber 110 and discharged via the second conveyance port 112 and the gas discharge line 52 as compared to the amount of the gas discharged from the space above the substrate S to the space below the substrate holder 120 via the gap G. This is effective to suppress particles entering from the loader chamber 30 to the internal space of the load lock chamber 110 via the second conveyance port 112.

The area of the gap G between the side surface of the substrate holder 120 and the inner side surface of the load lock chamber 110 is preferably smaller than the sectional area of the opening 142 provided in the bottom surface 144 of the extension chamber 140. This configuration is advantageous in reducing the particles from the pump 150 reaching the space above the substrate S via the gap G and adhering to the substrate S. The area of the gap G is preferably smaller than the sectional area (the sectional area along a vertical plane) of a connection portion 146 between the load lock chamber 110 and the extension chamber 140. This configuration is also advantageous in reducing the particles from the pump 150 reaching the space above the substrate S via the gap G and adhering to the substrate S.

A size Hh of the substrate holder 120 in the height direction is preferably larger than a size Lg of the gap G between the side surface of the substrate holder 120 and the inner side surface of the load lock chamber 110 (the distance between the side surface of the substrate holder 120 and the inner side surface of the load lock chamber 110). This configuration is advantageous in suppressing the particles from the pump 150 passing through the gap G. The size Hh of the substrate holder 120 in the height direction is preferably three times or more and 115 times or less the maximum size of the gap G. This configuration is advantageous in suppressing the particles from the pump 150 passing through the gap G and also suppressing the load lock chamber 110 becoming bulky.

A size He of the extension chamber 140 in the height direction is preferably larger than the size of the substrate holder 120 in the height direction Hh. This configuration is advantageous in increasing the efficiency of gas discharge by the pump 150. In a state in which the substrate S moves between the load lock chamber 110 and the transfer chamber 20 via the first conveyance port 111, the height of the lower end of the substrate holder 120 is preferably higher than the height of a ceiling surface 145 of the extension chamber 140. This configuration is advantageous in increasing the efficiency of gas discharge by the pump 150 in that state.

Figure 2:
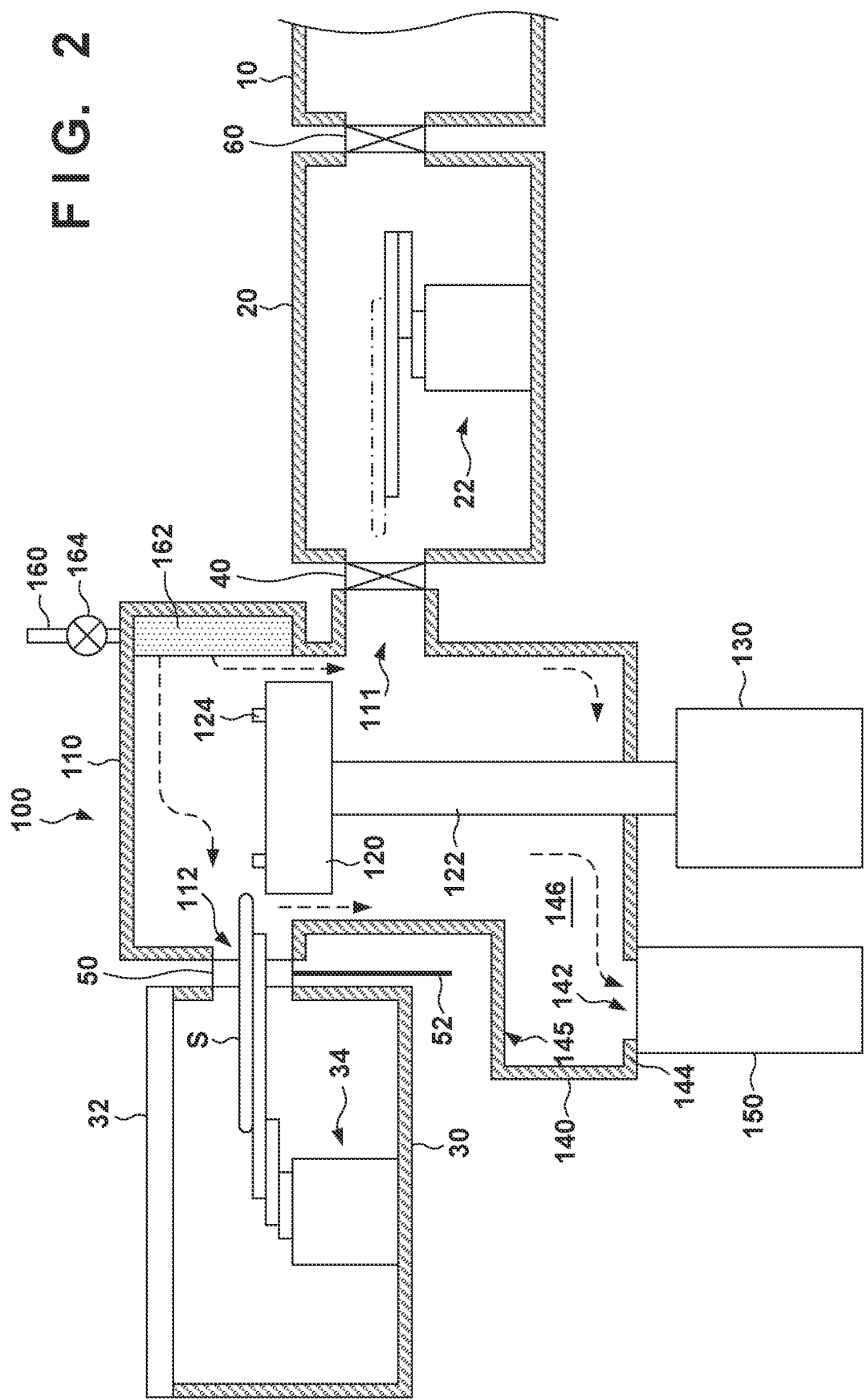
FIG. 2 is a view showing the operation of the processing device including the load lock device according to an embodiment of the present invention.

FIGS. 2, 3, 4, and 5 exemplarily show the operation of the processing device shown in FIG. 1. First, while introducing (supplying) the gas from the gas introducing portion 160 to the internal space of the load lock chamber 110, the gas in the internal space can be discharged by the pump 150 to the external space of the load lock chamber 110. At this time, to raise the pressure in the internal space, the introduction amount of the gas from the gas introducing portion 160 to the internal space can be made larger than the gas discharge amount by the pump 150. When the pressure in the internal space becomes equal to or more than the atmospheric pressure, the valve 50 can be opened, as shown in FIG. 2, and the gas discharge via the gas discharge line 52 can be started. After that, the conveyance robot 34 can convey the substrate S from the loader chamber 30 to the substrate holder 120 in the internal space of the load lock chamber 110.

Figure 3:
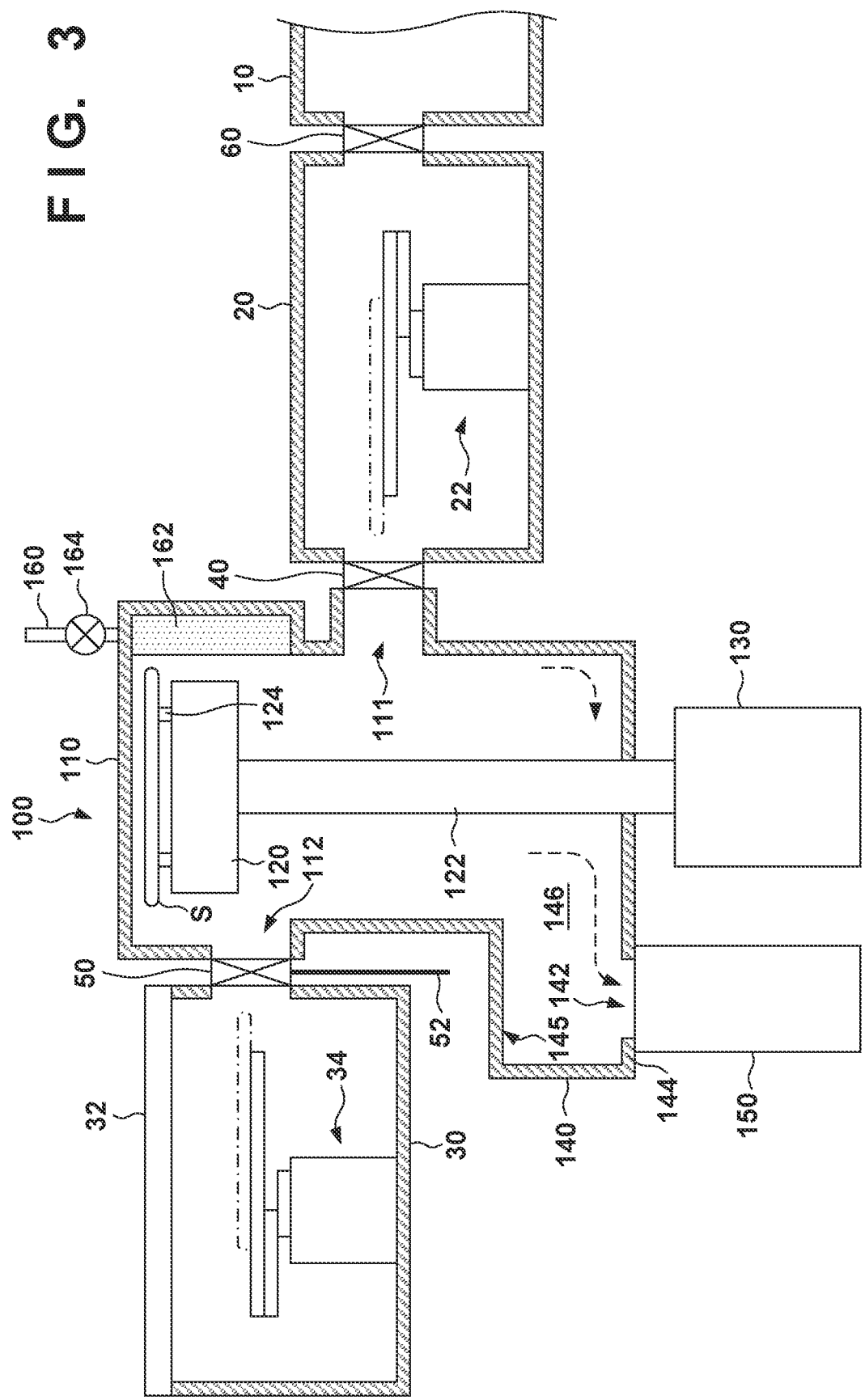
FIG. 3 is a view showing the operation of the processing device including the load lock device according to an embodiment of the present invention.

After that, as shown in FIG. 3, the valve 50 can be closed, and the substrate holder 120 can be driven upward by the driving mechanism 130. Also, in a state in which the gas is introduced from the gas introducing portion 160 to the internal space of the load lock chamber 110, the gas discharge amount from the internal space by the pump 150 is increased, and the pressure in the internal space is reduced. After that, gas introduction to the internal space by the gas introducing portion 160 can be stopped, and the gas discharge amount from the internal space by the pump 150 can further be increased.

Figure 4:
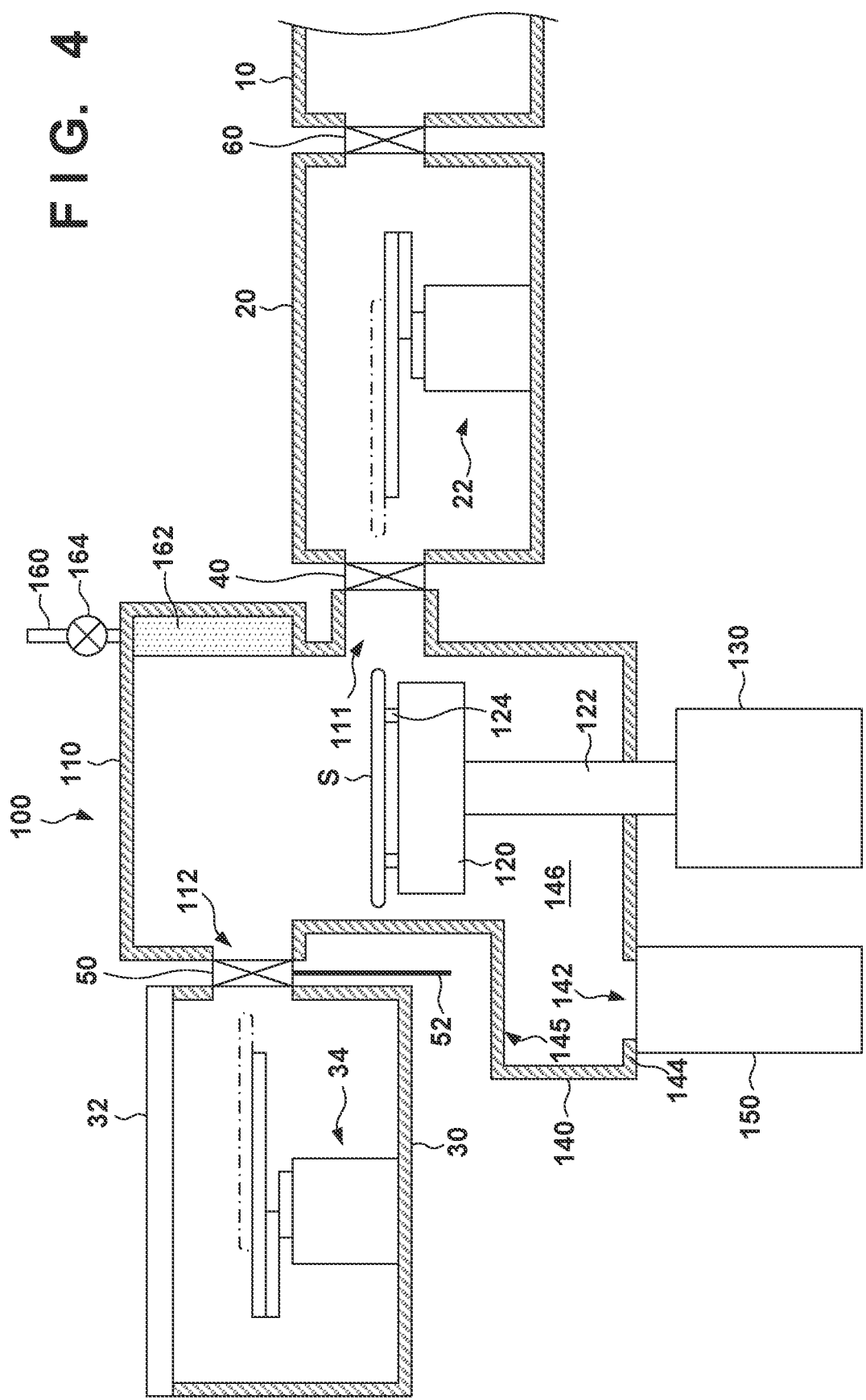
FIG. 4 is a view showing the operation of the processing device including the load lock device according to an embodiment of the present invention.
Figure 5:
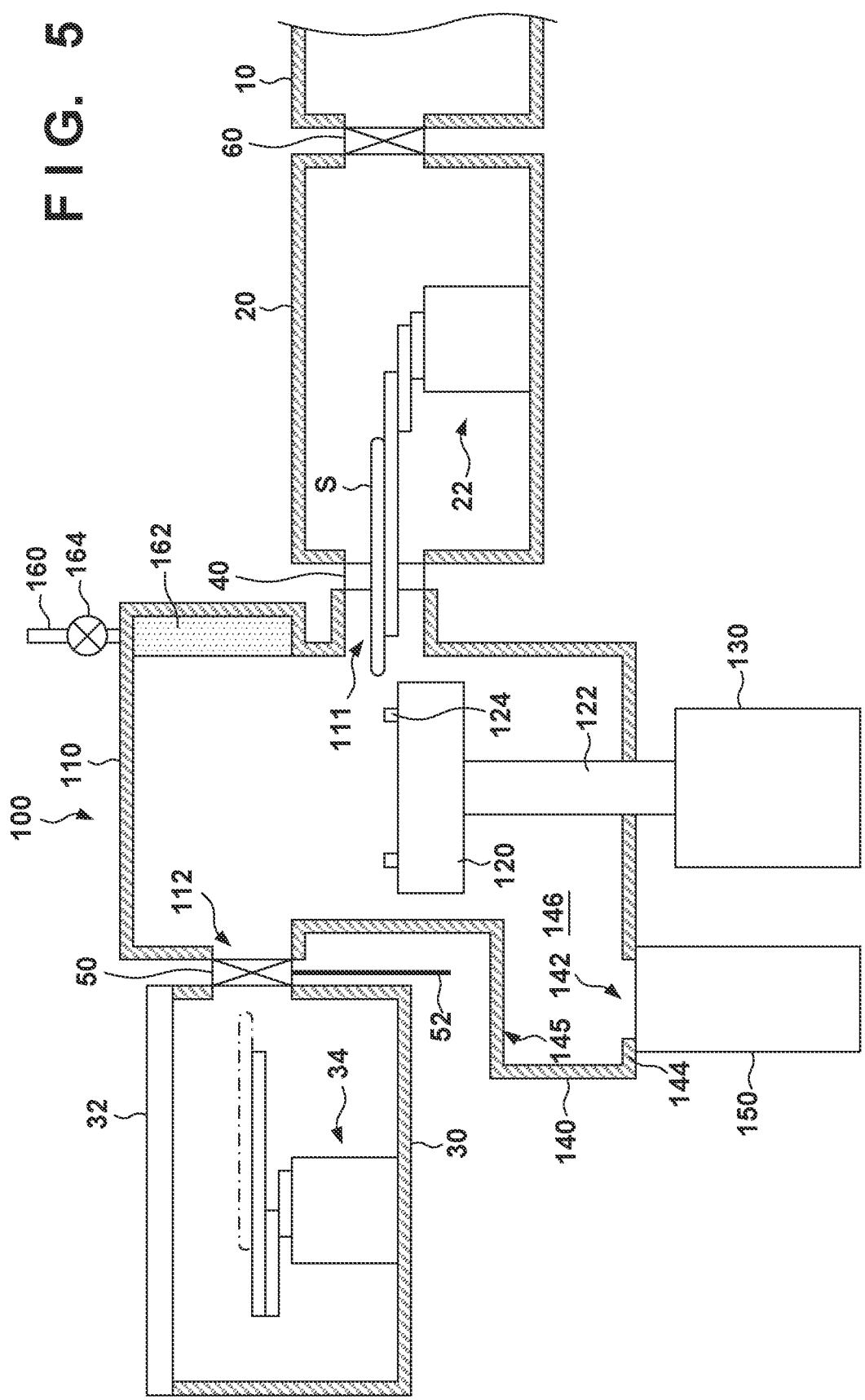
FIG. 5 is a view showing the operation of the processing device including the load lock device according to an embodiment of the present invention.

When the pressure in the internal space of the load lock chamber 110 is sufficiently reduced, the substrate holder 120 can be driven downward by the driving mechanism 130 up to a height to convey the substrate S to the transfer chamber 20, as shown in FIG. 4. After that, as shown in FIG. 5, the valve 40 can be opened, and the conveyance robot 22 can convey the substrate S from the internal space of the load lock chamber 110 to the transfer chamber 20 and then to the reduced-pressure processing device 10. Then, the valve 40 is closed, and the substrate S is processed in the reduced-pressure processing device 10.

After that, the valve 40 can be opened, and the conveyance robot 22 can convey the substrate S in the reduced-pressure processing device 10 to the internal space of the load lock chamber 110, as shown in FIG. 5. After that, the valve 40 can be closed.

Then, while introducing the gas from the gas introducing portion 160 to the internal space of the load lock chamber 110, the gas in the internal space can be discharged by the pump 150 to the external space of the load lock chamber 110. At this time, to raise the pressure in the internal space, the introduction amount of the gas from the gas introducing portion 160 to the internal space can be made larger than the gas discharge amount by the pump 150. When the pressure in the internal space becomes equal to or more than the atmospheric pressure, the valve 50 can be opened, as shown in FIG. 2, and the gas discharge via the gas discharge line 52 can be started. After that, the conveyance robot 34 can convey the substrate S from the substrate holder 120 in the internal space of the load lock chamber 110 to the loader chamber 30. After that, the valve 50 can be closed, and the gas discharge via the gas discharge line 52 can be stopped.

The present invention is not limited to the above embodiments and various changes and modifications can be made within the spirit and scope of the present invention. Therefore, to apprise the public of the scope of the present invention, the following claims are made.

REFERENCE SIGNS LIST

100 . . . load lock device, 110 . . . load lock chamber, 111 . . . first conveyance port, 112 . . . second conveyance port, 120 . . . substrate holder, 130 . . . driving mechanism, 140 . . . extension chamber, 142 . . . opening, 144 . . . bottom surface, 150 . . . pump, 160 . . . gas introducing portion, 162 . . . gas dispersing portion

The invention claimed is:

1. A load lock device comprising:
 a load lock chamber including a first conveyance port connected to a transfer chamber connected to a reduced-pressure processing device, and a second conveyance port connected to a loader chamber;
 a substrate holder configured to hold a substrate in the load lock chamber;
 a driving mechanism arranged below the load lock chamber to move the substrate holder up and down and connected to the substrate holder via a connecting member;
 an extension chamber extended from a lower portion of the load lock chamber to a side; and
 a pump arranged below the extension chamber and configured to discharge a gas in the load lock chamber via the extension chamber,
 wherein the extension chamber includes a bottom surface with an opening at a position deviated from a vertically lower position of the substrate holder, and the pump is connected to the opening.

2. The load lock device according to claim 1, further comprising a gas introducing portion arranged above a path between the substrate holder and the transfer chamber in a state in which the substrate is conveyed to the transfer chamber via the first conveyance port.

3. The load lock device according to claim 2, wherein a height of the first conveyance port is lower than a height of the second conveyance port.

4. The load lock device according to claim 2, wherein
 the gas introducing portion includes a gas dispersing portion configured to disperse the gas, and
 the gas dispersing portion is arranged at a position facing the second conveyance port.

5. The load lock device according to claim 2, wherein an area of a gap between a side surface of the substrate holder and an inner side surface of the load lock chamber is smaller than a sectional area of the second conveyance port.

6. The load lock device according to claim 2, wherein an area of a gap between a side surface of the substrate holder and an inner side surface of the load lock chamber is smaller than ½ a sectional area of the second conveyance port.

7. The load lock device according to claim 1, wherein an area of a gap between a side surface of the substrate holder and an inner side surface of the load lock chamber is smaller than a sectional area of the opening.

8. The load lock device according to claim 1, wherein an area of a gap between a side surface of the substrate holder and an inner side surface of the load lock chamber is smaller than a sectional area of a connection portion between the load lock chamber and the extension chamber.

9. The load lock device according to claim 1, wherein a size of the substrate holder in a height direction is larger than a size of the gap between the side surface of the substrate holder and the inner side surface of the load lock chamber.

10. The load lock device according to claim 1, wherein a size of the substrate holder in a height direction is not less than three times and not more than 115 times a maximum size of the gap between the side surface of the substrate holder and the inner side surface of the load lock chamber.

11. The load lock device according to claim 1, wherein a size of the extension chamber in the height direction is larger than the size of the substrate holder in the height direction.

12. The load lock device according to claim 1, wherein in a state in which the substrate moves between the load lock chamber and the transfer chamber via the first conveyance port, a height of a lower end of the substrate holder is higher than a height of a ceiling surface of the extension chamber.

13. The load lock device according to claim 1, wherein at least a part of the second conveyance port is arranged above the extension chamber.

14. The load lock device according to claim 1, wherein at least a part of the extension chamber is arranged between the second conveyance port and the pump.

15. The load lock device according to claim 1, wherein at least a part of the loader chamber is arranged above the extension chamber.

16. The load lock device according to claim 1, wherein at least a part of the extension chamber is arranged between the loader chamber and the pump.

17. The load lock device according to claim 1, further comprising a gas dispersing portion configured to disperse the gas in an internal space of the load lock chamber,
wherein the gas dispersing portion is arranged to face the second conveyance port, and
at least a part of the second conveyance port is arranged above the extension chamber.

18. The load lock device according to claim 1, further comprising a gas dispersing portion configured to disperse the gas in an internal space of the load lock chamber,
wherein the gas dispersing portion is arranged to face the second conveyance port, and
at least a part of the extension chamber is arranged between the second conveyance port and the pump.

19. The load lock device according to claim 1, further comprising a gas dispersing portion configured to disperse the gas in an internal space of the load lock chamber,
wherein the gas dispersing portion is arranged to face the second conveyance port, and
at least a part of the loader chamber is arranged above the extension chamber.

20. The load lock device according to claim 1, further comprising a gas dispersing portion configured to disperse the gas in an internal space of the load lock chamber,
wherein the gas dispersing portion is arranged to face the second conveyance port, and
at least a part of the extension chamber is arranged between the loader chamber and the pump.

21. The load lock device according to claim 17, wherein a position where the substrate holder can be arranged includes a position where a part of a side surface of the substrate held by the substrate holder faces the gas dispersing portion.

22. The load lock device according to claim 1, further comprising a gas dispersing portion configured to disperse the gas in an internal space of the load lock chamber,
wherein in an orthogonal projection to a floor on which the load lock device is arranged, the substrate holder is located between the gas dispersing portion and the extension chamber.

23. The load lock device according to claim 1, further comprising a gas dispersing portion configured to disperse the gas in an internal space of the load lock chamber,
wherein in an orthogonal projection to a floor on which the load lock device is arranged, the substrate holder is located between the gas dispersing portion and the opening.

24. The load lock device according to claim 1, wherein in a state in which the substrate is transferred between the load lock chamber and the transfer chamber via the first conveyance port, a height of a lower end of the substrate holder is higher than a height of a ceiling surface of the extension chamber.

25. The load lock device according to claim 1, wherein the extension chamber is arranged at a height lower than a height where the first conveyance port is arranged.

26. The load lock device according to claim 1, wherein a ceiling surface of the extension chamber is arranged at a height lower than a height where the first conveyance port is arranged.

27. The load lock device according to claim 1, wherein a ceiling surface of the extension chamber is arranged at a height lower than a height where a lower end of the first conveyance port is arranged.

28. The load lock device according to claim 4, wherein when the substrate is conveyed from the loader chamber to an internal space of the load lock chamber via the second conveyance port, the gas introduced from the gas dispersing portion to the internal space of the load lock chamber is discharged via the second conveyance port to the loader chamber via the second conveyance port.

29. The load lock device according to claim 28, further comprising a conveyance robot arranged in the loader chamber, wherein the conveyance robot is configured to convey the substrate from the loader chamber to the load lock chamber via the second conveyance port.

* * * * *